United States Patent [19]
Barringer et al.

[11] Patent Number: 6,034,524
[45] Date of Patent: Mar. 7, 2000

[54] APPARATUS AND METHOD FOR TESTING FLEXIBLE CIRCUIT SUBSTRATES

[75] Inventors: Wayne Albert Barringer, Boca Raton; James Edward Boyette, Jr., Delray Beach; Guenter Schaefer, Fort Lauderdale, all of Fla.

[73] Assignee: International Business Machines Corporation, Armonk, N.Y.

[21] Appl. No.: 08/895,709

[22] Filed: Jul. 17, 1997

[51] Int. Cl.[7] .............................. G01R 1/04; G01R 31/02
[52] U.S. Cl. ...................... 324/158.1; 324/754; 324/758
[58] Field of Search .................................. 324/158.1, 72, 324/754, 758

[56] References Cited

U.S. PATENT DOCUMENTS

| | | | |
|---|---|---|---|
| 4,667,944 | 5/1987 | Althouse | 269/21 |
| 4,711,014 | 12/1987 | Althouse | 29/412 |
| 4,778,326 | 10/1988 | Althouse et al. | 414/786 |
| 4,841,241 | 6/1989 | Hilz et al. | 324/158 F |
| 4,967,950 | 11/1990 | Legg et al. | 228/180.22 |
| 4,998,885 | 3/1991 | Beaman | 439/66 |
| 5,087,878 | 2/1992 | Belmore, III et al. | 324/158 F |
| 5,136,797 | 8/1992 | Hildebrandt | 38/102.91 |
| 5,157,325 | 10/1992 | Murphy | 324/158 F |
| 5,434,504 | 7/1995 | Hollis et al. | 324/207.17 |
| 5,461,324 | 10/1995 | Boyette et al. | 324/754 |
| 5,467,020 | 11/1995 | Boyette, Jr. et al. | 324/537 |
| 5,532,611 | 7/1996 | Lo et al. | 324/758 |
| 5,543,726 | 8/1996 | Boyette, Jr. et al. | 324/758 |
| 5,550,483 | 8/1996 | Boyette, Jr. et al. | 324/758 |
| 5,631,856 | 5/1997 | Keller et al. | 324/758 |
| 5,635,849 | 6/1997 | Lo et al. | 324/758 |

OTHER PUBLICATIONS

27535, Work Board For Flexible Circuitry, *Research Disclosure*, Mar. 1987, Number 275, Kenneth Mason Publications. Ltd, England.

*IBM Technical Disclosure Bulletin*, Automatic Printed Circuits and Plated Through Hole Tester, vol. 14, No. 12, May, 1972, pp. 3623–3624.

*Primary Examiner*—Josie Ballato
*Assistant Examiner*—Jermele M. Hollington
*Attorney, Agent, or Firm*—Ronald V. Davidge; Richard A. Tomlin

[57] ABSTRACT

A test system for applying electrical tests to circuits on flexible substrates includes a first transport system moving frames, each of which is configured for holding a single such flexible substrate, a loading station in which the substrates are individually loaded onto the frames, a testing station in which the electrical tests are applied, and an unloading station in which the substrates are removed from the frames. Within the testing station, each frame is disengaged from the first transport system and fastened to a second transport system, which moves the frame in a pattern causing a number of segments of the substrate within the frame to be placed between probe arrays adjacent each of the opposite sides of the substrate. These arrays are each aligned with visual markings on the adjacent side of the substrate, and the arrays are then moved into engagement with the substrate for the testing process. When testing of a particular substrate is complete, the frame is disengaged from the second transport system and fastened to the first transport system to be carried to the unloading station.

34 Claims, 6 Drawing Sheets

APPARATUS AND METHOD FOR TESTING FLEXIBLE CIRCUIT SUBSTRATES

CROSS-REFERENCE TO RELATED APPLICATIONS

U.S. patent applications, Ser. Nos. 08/814,385 and 08/815,061, which has issued as U.S. Pat. No. 5,891,295 both filed Mar. 11, 1997 which are hereby incorporated by reference, having a common assignee with the present application, describe apparatus for moving flexible substrates through a manufacturing process. The substrates are held and tensioned within individual frames, which are moved through the process by a pair of conveyer chains.

BACKGROUND OF THE INVENTION

1. Field of the Invention

This invention relates to testing flexible substrates with circuit elements, and, more particularly, to apparatus tensioning such a substrate within a frame and for applying circuit tests by means of an array of probes simultaneously contacting various points within the circuit from each side of the substrate.

2. Description of the Background Art

Certain problems associated with the testing of flexible printed circuit substrates are addressed in U.S. Pat. No. 5,467,020, which describes a mechanism in which a flexible circuit substrate is fed between an upper plate and a lower plate for circuit testing applied by movable, or flying probes. The upper plate includes a number of upper apertures extending across the flexible substrate and a number of upper segments, also extending across the flexible substrate, between adjacent apertures. The lower plate includes lower segments extending under the upper apertures and lower apertures extending under the upper segments. Two upper test probes are moved above the flexible substrate, while two lower test probes are moved under the flexible substrate. Tests are applied to both sides of the flexible substrate as the probes are brought into contact with test points in the areas accessible through the upper and lower apertures, with segments extending along the apertures on the opposite sides of the flexible substrate providing a backing surface for probe contact.

Thus, while U.S. Pat. No. 5,567,020 describes a mechanism providing a backing surface for probing from each side with flying probes, a mechanism facilitating the use of large numbers of probes in a stationary configuration, which is often capable of providing test results for a dense, complex circuit much more quickly, is not described. Furthermore, while this patent describes a system testing circuits extending along a long substrate, an efficient method for handling large numbers of discrete substrates is not described.

A number of prior art publications and patents describe frames for tensioning flexible circuit substrates and the like. For example, a work board for holding a flexible circuit flat to provide compatibility with automated, robotic assembly and handling during the manufacturing processes of building a populated working flexible circuit is described in Article 37535, *RESEARCH DISCLOSURE*, March, 1987, number 275, Kenneth Mason Publications Ltd., England. This work board includes a frame having two holes, spaced at midpoints along opposite sides, receiving pins extending through holes in the flexible circuit substrate to locate the substrate. At each corner of the work board, a spring-loaded, low profile slider hooks into an additional hole in the flexible circuit substrate, which is tensioned by pulling all four corners as it is held in place at mid-points along opposite sides.

However, this work board includes a number of mechanical clamping devices, indicating that the tensioning concepts described in this article would be particularly difficult to apply within a testing device requiring a rapid, automated attachment of the substrate to a board used to transport the substrate through testing processes, and rapid, automated detachment of the substrate from the board. Furthermore, six special holes must be placed in the circuit being manufactured for engagement with these clamping devices.

U.S. Pat. Nos. 4,667,944, 4,711,044, and 4,778,326 describe apparatus for handling semiconductor chips and like objects. In U.S. Pat. Nos. 4,667,944 and 4,711,044, the object to be handled is placed on a flat flexible film that is supported on a flat, porous texturized porous texturized fabric sheet, such as a woven or knit fabric having spaced fiber crossovers. In U.S. Pat. No. 4,778,326, the object to be handled is attached to the face of a base member, with the face being formed with recesses covered by the flat flexible film. In the apparatus of all three patents, objects are supported on the flat flexible film in intimate surface contact therewith for securely holding the same in position by interfacial forces therebetween. Adhesive may be included for increasing the interfacial force. To facilitate removal of objects from the film, the fabric of U.S. Pat. Nos. 4,667,944 and 4,711,044 is connected to a vacuum source for drawing portions of the flexible film over and between crossovers in the fabric. Similarly, the recesses of the face of the base member described in U.S. Pat. No. 4,778,326 are connected to a vacuum source, drawing portions of the flexible film into the recesses and providing the film with a textured, or undulating surface. In any case, the application of a vacuum causes portions of the film to be withdrawn from the object being held, reducing the area of contact between the flexible film and the object being held, and hence the interfacial forces therebetween. In this way the removal of the object using a conventional technique is enabled.

While the methods of U.S. Pat. Nos. 4,667,944, 4,711,044, and 4,778,326 are particularly effective in facilitating the handling of small, flat devices, such as semiconductor chips, what is needed is an effective method for handling relatively large flexible sheets, which may include, for example, a number of identical circuits to be cut apart when processing is finished. Since the methods of these three patents are designed for small chips, a need to hold flexible sheets in a taut, tensioned condition is not addressed. An effective, automated system for attaching flexible sheets to frames holding such sheets in a tensioned condition, for transporting such frames with sheets attached therethrough into and out of an inspection process, and for subsequently removing the sheets from the frames is also needed.

Apparatus for applying tests with two probes on each side of a vertically oriented rigid circuit board is described in the *IBM Technical Disclosure Bulletin*, Vol. 14, No. 12, May 1972, pp. 3623–3624. However, this apparatus does not include means for handling flexible circuit substrates, or for moving substrates through the test process in a fast, efficient manner.

U.S. Pat. No. 4,998,885 describes an interposer for electrically connecting two substrates with high density interconnections. The interposer comprises an elastomeric material surrounding fine metal wires which extend through the elastomeric material. The elastomeric material provides mechanical support and electrical isolation for the wires. What is needed is a mechanism using the device described in this patent to apply testing signals, and to sense resulting signals, in a circuit under test, with a number of copies of the circuit being presented in a rapid, automated, and efficient manner to the interposer.

U.S. Pat. No. 5,434,504 describes position sensors for detecting the position of a linear motor relative to a platen. In particular, these sensors are described in an arrangement including a Sawyer motor forcer. What is needed is a mechanism using a positioning arrangement of this kind to position large number of circuit test probes.

The above-described examples of prior-art devices do not describe means for simultaneously applying a large number of probes to opposing sides of a flexible circuit substrates, for moving a substrate so that various portions thereof are presented to fixed probe configurations, or for marking individual portions of a substrate which is divisible into a number of discrete segments so that those segments failing circuit tests applied thereto are not inadvertently used following the test process. Furthermore, none of these examples of prior-art devices include a mechanism for aligning the test probes in response to visual indications on the circuit board.

SUMMARY OF THE INVENTION

Accordingly, it is an objective of the present invention to provide a rapid and automated means for handling circuit substrates through an inspection process using the simultaneous application of a number of electrical probes.

It is another objective of the invention to provide a means for tensioning flexible substrates as they are carried through the inspection process.

It is another objective of the invention to provide a first means for transporting circuit substrates into, and away from, a test station, and a separate second means for transporting circuit substrates within the test station past an area of contact with test probes in a stepwise fashion.

It is another objective of the invention to provide a means for aligning a probing structure within a test station with visual indicia on a circuit substrate.

It is another objective of the invention to provide a means facilitation the simultaneous application of probing structures to opposite sides of a circuit substrate.

It is another objective of the invention to provide a means, operable upon a substrate which is subsequently divided into segments, for preventing the subsequent inadvertent use of segments which have failed circuit testing processes.

In accordance with one aspect of the invention, there is provided apparatus for applying electrical tests to a number of circuit substrates. The apparatus includes a first transport system, a loading station, a test station, and an unloading station. The first transport system moves a number of frames around a path formed as a loop. The loading station loads a circuit substrate onto a frame attached to the first transport system. The test station includes a first number of probes movable against a first surface of the circuit substrate in a first inspection area, a second transport system moving the frame with the circuit substrate loaded thereon so that the first surface is moved to the first inspection area, and a frame transfer mechanism for transferring the frame with the circuit substrate loaded thereon between the first and second transport systems. The unloading station unloads the circuit substrate from the frame attached with the first transportation system.

In accordance with another aspect of the invention, the frames are moved by both the first and second transport systems with the circuit substrate in a vertical orientation, so that a flexible substrate will not droop under the influence of gravity. Each frame includes an upper clip, holding an upper edge of the circuit substrate, and a lower clip, holding a lower edge of the circuit substrate. The lower clip is slidably mounted on the frame, so that the weight of the lower clip itself applies a tensioning force to the circuit substrate.

In accordance with another aspect of the invention, the second transport system moves the frame in an incremental motion, stopping in a number of positions with an individual segment adjacent the first number of probes, which are moved against the substrate while it is stopped to apply tests to one or more circuits in the segment. Data is taken describing each segment including one or more failing circuits.

In accordance with another aspect of the invention, a punching station is provided to punch a hole in each segment including one or more failing circuits, as determined from this data.

In accordance with another aspect of the invention, probes are driven against opposite sides of each segment of the circuit board, with the probes being positionable as arrays along each side of the circuit board. Before the probes are moved into contact with an individual segment, visual markings on the segment are used to move the probe on each side of the substrate into alignment with the actual position of the segment, as determined by one or more electronic cameras viewing the markings on the adjacent side of the substrate.

The foregoing and other objectives, features, aspects, and advantages of the present invention will become more apparent from the following detailed description of the present invention when taken in conjunction with the accompanying drawings.

DETAILED DESCRIPTION

Figure 1:
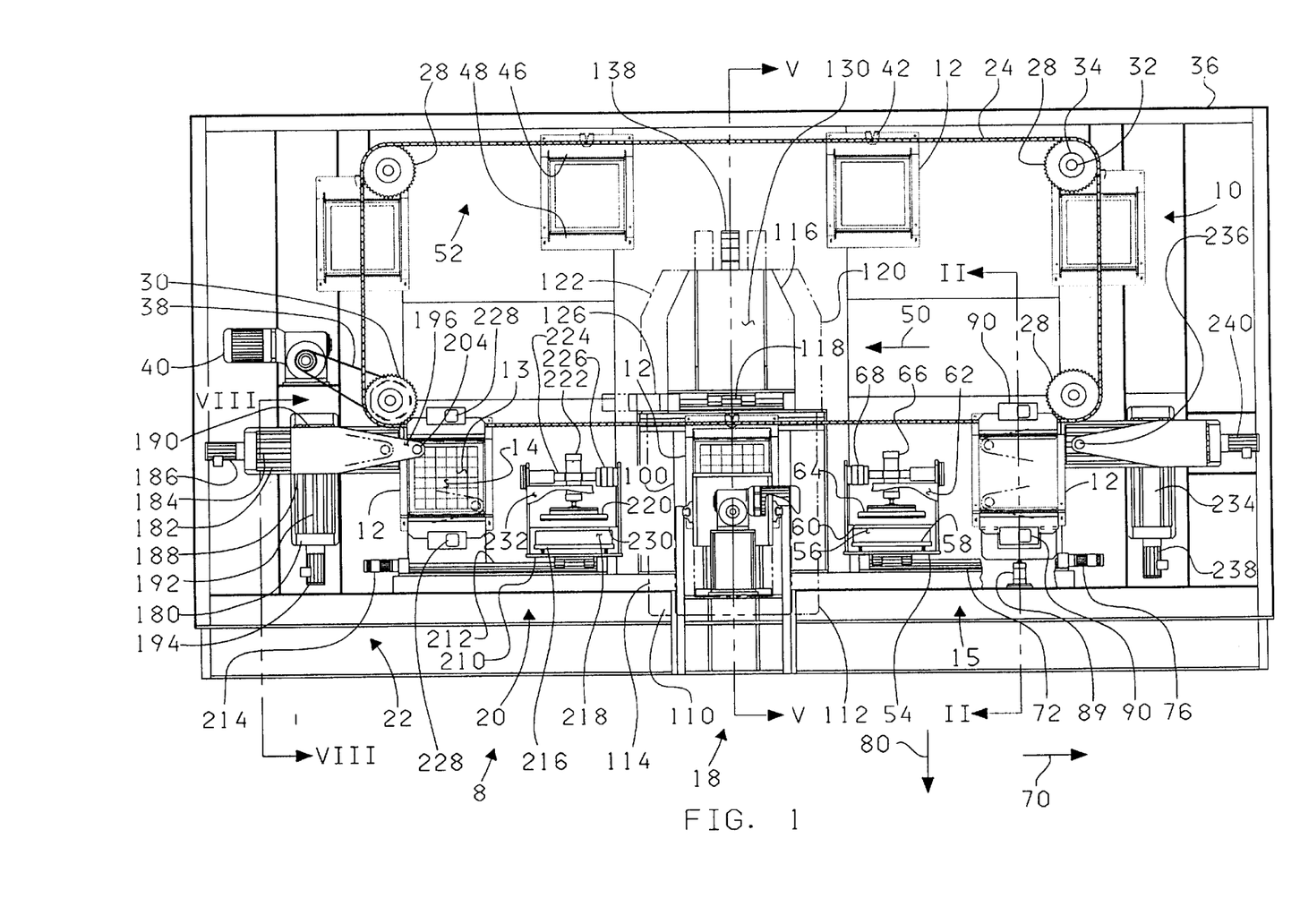
FIG. 1 is a front elevation of the test system built in accordance with the present invention, shown with system covers removed to expose internal components thereof.

FIG. 1 is a front elevation of the test system 8 built in accordance with the present invention, shown with system covers removed to expose internal components. A first principle component of the test system 8 is a frame circulating system, generally indicated as 10, in which seven frames 12, each of which is configured for carrying a circuit substrate 13 through the testing process, are circulated among various stations of the system. In general, the circuit substrate 13 includes a number of substrate segments 14, each of which has a similar circuit being presented for testing. A second principles component of the test system 8 is a loading station, generally indicated as 15, in which individual circuit substrates 13 are loaded into the individual frames 12. A third principle component of the test system 8 is a test station, generally indicated as 18, in which the test process occurs, A fourth principle component of the test system 8 is an unloading station, generally indicated as 20, in which each circuit substrate 13, having completed the testing process in test station 18 is unloaded from a frame 12. A fifth principle component of the test system 8 is a punching station, generally indicated as 22, which operates on a substrate 13 within the unloading station 20 to punch a hole in each substrate segment 14 which has failed the tests occurring in testing station 18.

Frame Circulating System

Figure 2:
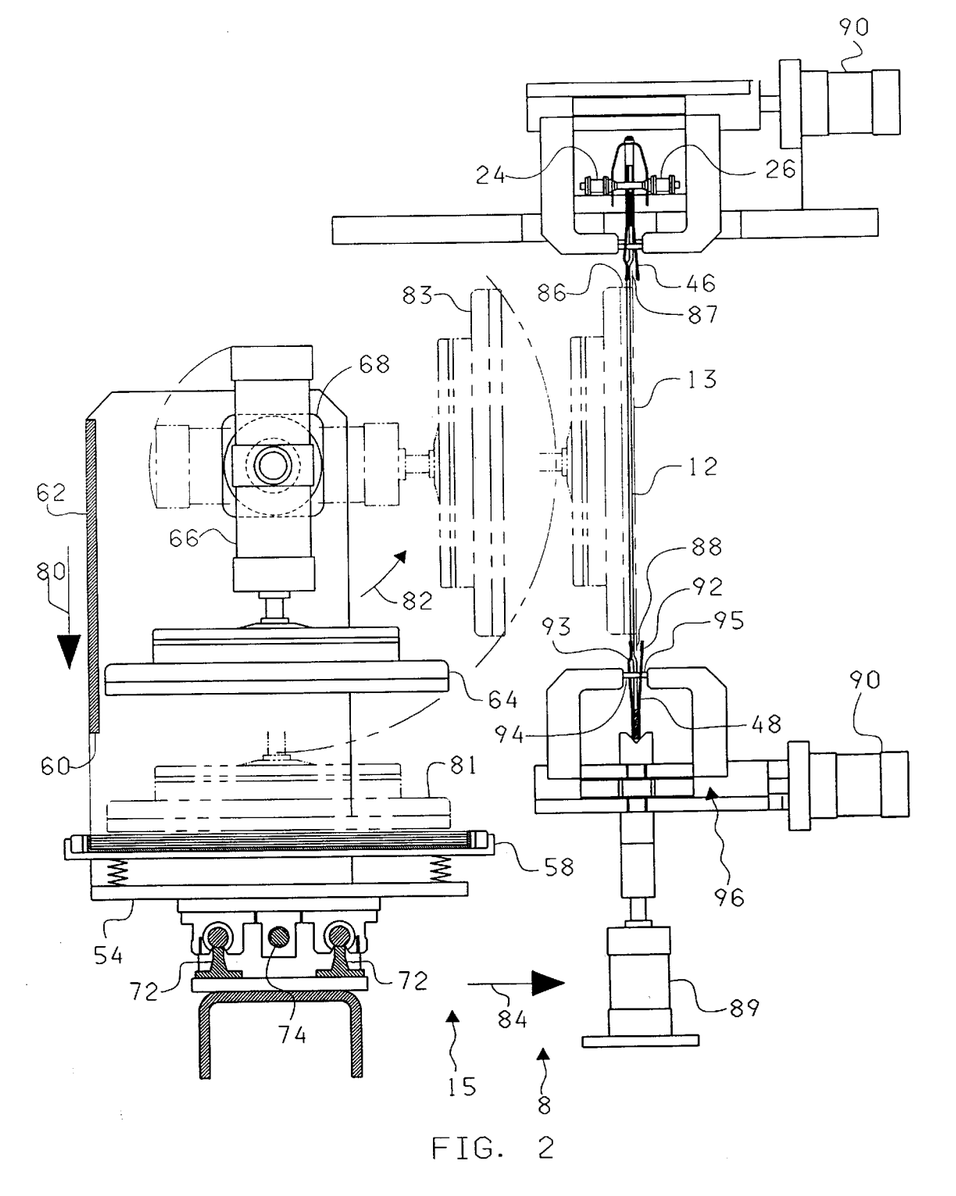
FIG. 2 is a cross-sectional elevation taken as indicated by section lines 11—11 in FIG. 1 to show a substrate loading station within the test system of FIG. 1.

FIG. 2 is a cross-sectional elevation taken as indicated by section lines 11—II in FIG. 1 to show the loading station 15 and a portion of the frame circulating system 10.

The frame circulating system 10 will now be described, with reference being made to FIGS. 1 and 2. The frame circulating system 10 includes a front drive chain 24 and a rear drive chain 26, each of which extends around three idler sprockets 28 and a drive sprocket 30. The two drive chains 24, 26 are held in a spaced-apart relationship so that the frames 12 can hang between them. Each idler sprocket 28 is attached to an idler shaft 32, which is rotatably mounted within a bearing assembly 34. Each bearing assembly 34 is in turn attached to the framework 36 of the test system 8. Each drive sprocket 30 is rotatably driven by a separate chain drive 38 from a common gearmotor 40.

Figure 3:
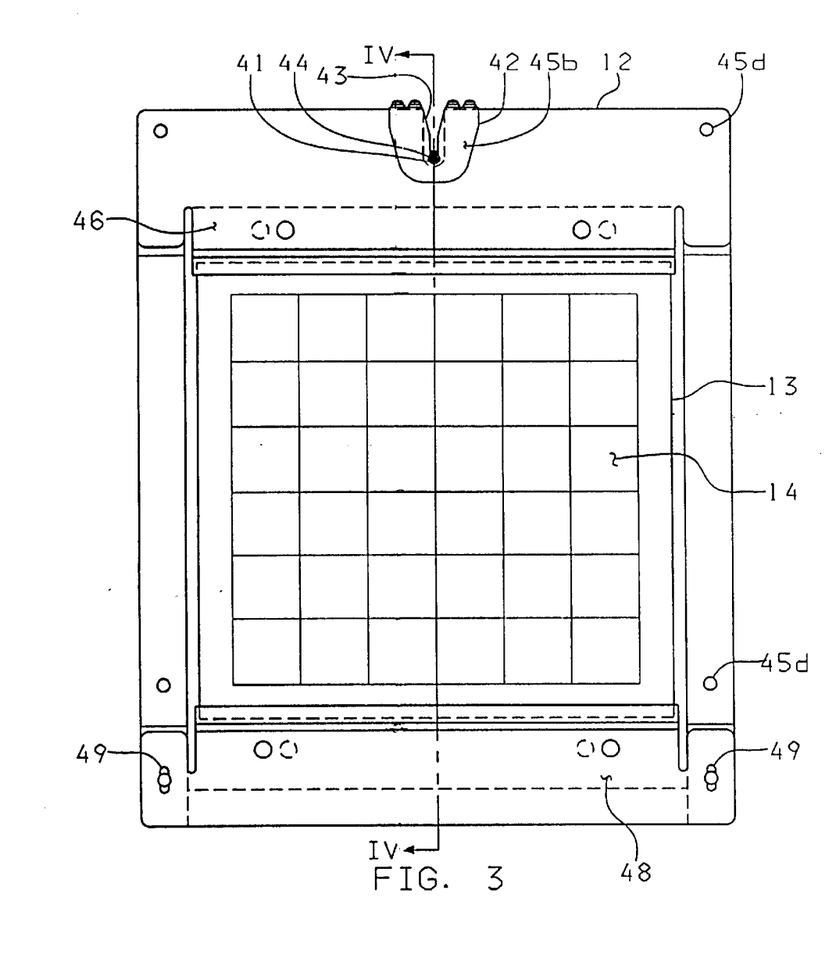
FIG. 3 is an elevation of a frame circulated for carrying a substrate to be tested within the test system of FIG. 1.
Figure 4:
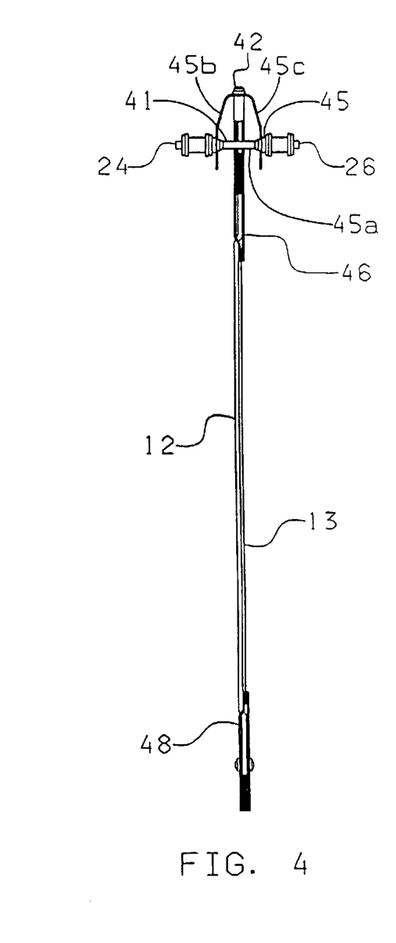
FIG. 4 is a cross-sectional view of the frame of FIG. 3, taken as indicated by section lines IV—IV in FIG. 3.

FIGS. 3 and 4 are views of the frame 12 holding a flexible circuit substrate 13, with FIG. 3 being a side elevation thereof, while FIG. 4 is a cross-sectional view thereof, being taken as indicated by section lines IV—IV in FIG. 3. The drive chains 24, 26 are interconnected by a number of mounting pins 41, each of which defines a point at which a frame 12 may be mounted. Each frame 12 includes a mounting clip 42, removably attaching the frame 12 to a mounting pin 41 in a manner allowing the frame 12 to travel with the drive chains 24, 26, while pivoting between them. The mounting clip 42 includes an upwardly-directed slot 43 having an enlarged lower end 44. The mounting pin 41 includes enlarged-diameter outer portions 45 and a reduced-diameter central portion 45a. The mounting clip 42 is composed of a resilient material holding the enlarged lower ends 44 of the slot 43 over, and in engagement with, the enlarged-diameter outer portions 45 of the pin 41. The frame 12 is disengaged from the drive chains 24, 26 by squeezing the opposing sides 45b, 45c thereof so that both of the enlarged lower ends 44 of the slot 43 become aligned with the reduced-diameter central portion 45a of the pin 41. The frame 12 also includes a number of holes 45d by which the frame 12 is engaged and transported when it is out of engagement with the mounting pin 41.

Each frame 12 additionally includes, as provisions for holding and tensioning a flexible circuit substrate 13, an upper clamp 46 and a lower clamp 48. While these clamps 46, 48 are normally held shut by spring forces so that a circuit substrate 13 is held therein, they are forced open to allow the insertion and removal of a circuit substrate 13 therefrom within the loading station 15 and the unloading station 20, respectively. The lower clamp 48 is mounted to slide vertically on its associated frame 12 at slots 49, allowing the weight of the lower clamp 48 to tension the flexible circuit substrate 13.

Referring again to FIGS. 1 and 2, the drive chains 24, 26 are moved in an incremental fashion, in the direction indicated by arrow 50, with two frames 12 being held within the loading station 15 and unloading station 20, allowing the performance of various processes required in these stations 15, 20. While these frames 12 are held within the loading station 15 and the unloading station 20 a third frame 12, between the frames in these stations 15, 20 on the drive chains 24, 26, is removed from these drive chains 24, 26 within the test station 18, to be moved independently in a fashion required by the testing process. After the testing process is completed, the frame 12 within the test station 18 is re-attached to the drive chains 24, 26. Next, the drive chains 24, 26 are driven in the direction of arrow 50 to move the frame 12 in unloading station 20, from which a circuit substrate 13 has just been removed, upward into a recirculation path 52 of the frame circulation system 10. During this movement of the drive chains 24, 26, the frame 12 within the test station 18, holding a circuit substrate 13 which has just been tested, is moved to the unloading station 20, and the frame 12 within the loading station 15, holding a circuit substrate 13 to be tested, is moved to the test station 18. Thus processes occurring within the loading station 15, the test station 18, and the unloading station 20 occur simultaneously, with the subsequent movement of frames 12 among these stations subsequently also occurring simultaneously.

Loading Station

The loading station 15 will now be discussed, with continued reference being made to FIGS. 1 and 2. The loading station 15 includes a supply station 54 holding a stack 56, of circuit substrates 13 to be tested, atop a spring mounted tray 58. This stack 56 is loaded into the supply station 54 through a slot 60 extending beneath a front plate 62. The supply station 54 also includes a vacuum plenum 64 sliding with a linear pneumatic actuator 66 and pivoting with a rotary pneumatic actuator 68. The vacuum plenum 64 is attached by means of a flexible hose (not shown) to a vacuum system (also not shown), so that a vacuum can be achieved in this plenum 64 to pick up and hold a single circuit substrate 13. Valve means (also not shown) allow the vacuum within the plenum 64 to be relieved, so that a circuit substrate 13 can be released therefrom. The supply station 54 is mounted to slide in the direction of arrow 70 on a pair of rails 72, being moved by a drive screw 74 rotated by a motor 76.

The process of loading a single circuit substrate 13 into an awaiting empty frame 12 within the loading station 15 is begun as the vacuum plenum 64 is lowered in the direction of arrow 80 by means of the linear pneumatic actuator 66, into the position indicated by phantom lines 81. A vacuum is applied within the vacuum plenum 64, so that a single circuit substrate 13 is attached to the plenum 64, and the vacuum plenum 64 is raised, opposite the direction of arrow 80 by means of the linear pneumatic actuator 66. Next, the vacuum plenum 64 is pivoted ninety degrees in the direction of arrow 82 by means of rotary pneumatic actuator 68, into the position indicated by phantom lines 83, and the vacuum plenum 64 is moved to the rear, in the direction of arrow 84 by means of the linear pneumatic actuator 66, into the position indicated by phantom lines 86. This movement of the vacuum plenum 64 moves the circuit substrate 13 which it carries into alignment with the frame 12 in loading station 15, onto which this substrate 13 is to be placed.

The vacuum plenum 64 is somewhat narrower than the substrate 13, so that an upper edge portion 87 of the substrate 13 extends above the plenum 64 to be gripped by the upper mounting clip 46 of this frame 12, and so that a lower edge portion 88 of the substrate 13 extends below the plenum 64 to be gripped by the lower mounting clip 48 of this frame 12. Before the circuit substrate 13 being held in a vertical orientation by vacuum plenum 64 is inserted into the waiting frame 12, a pneumatic actuator 89 lifts the lower mounting clip 48 of the frame 12. Then a pair of pneumatic actuators 90 open both the lower mounting clip 48 and the upper mounting clip 46.

Each mounting clip 46, 48 includes a rear clamping plate 92 and a front clamping plate 93, which are held together as deflected beams to clamp the circuit substrate 13 in place. For loading the substrate 13 into place, the rear clamping plate 92 is deflected toward the rear, in the direction of arrow 84, by a pin 94, extending through a clearance hole in the front clamping plate 93. Also, for loading the substrate 13 into place, the front clamping plate 93 is deflected toward the front, opposite the direction of arrow 84, by a pin 95, extending through a clearance hole in the rear clamping plate 92. The pins 94, 95 are mounted in jaws 96 driven in opposing directions by the actuator 90 through the operation of a rack-and-pinion mechanism 97.

Next, motor 76 moves the supply station 54 in the direction of arrow 70, with the upper and lower edges of the substrate 13 held by the vacuum plenum 54 being moved into the open mounting clips 46, 48. From this point, various movements described above are repeated in reverse order, with the pneumatic actuators 90 first releasing the clips 46, 48, which close to grip the edges of the substrate 13. Then a valve (not shown) is operated to allow the movement of air into the vacuum plenum 64, so that the substrate 13 is released to be held only by the mounting clips 46, 48. Then, the pneumatic actuator 89 moves downward, allowing the lower clip 48 to move downward so that its weight tensions the flexible circuit substrate 13. Next, the supply station 54 is returned opposite the direction of arrow 70, the vacuum plenum 64 is moved forward, opposite the direction of arrow 84 and is pivoted downward, opposite the direction of arrow 82. From this position, the supply station 54 is ready to begin the process described above again, placing the next substrate 13 in the next empty frame 12.

Test Station

Figure 5:
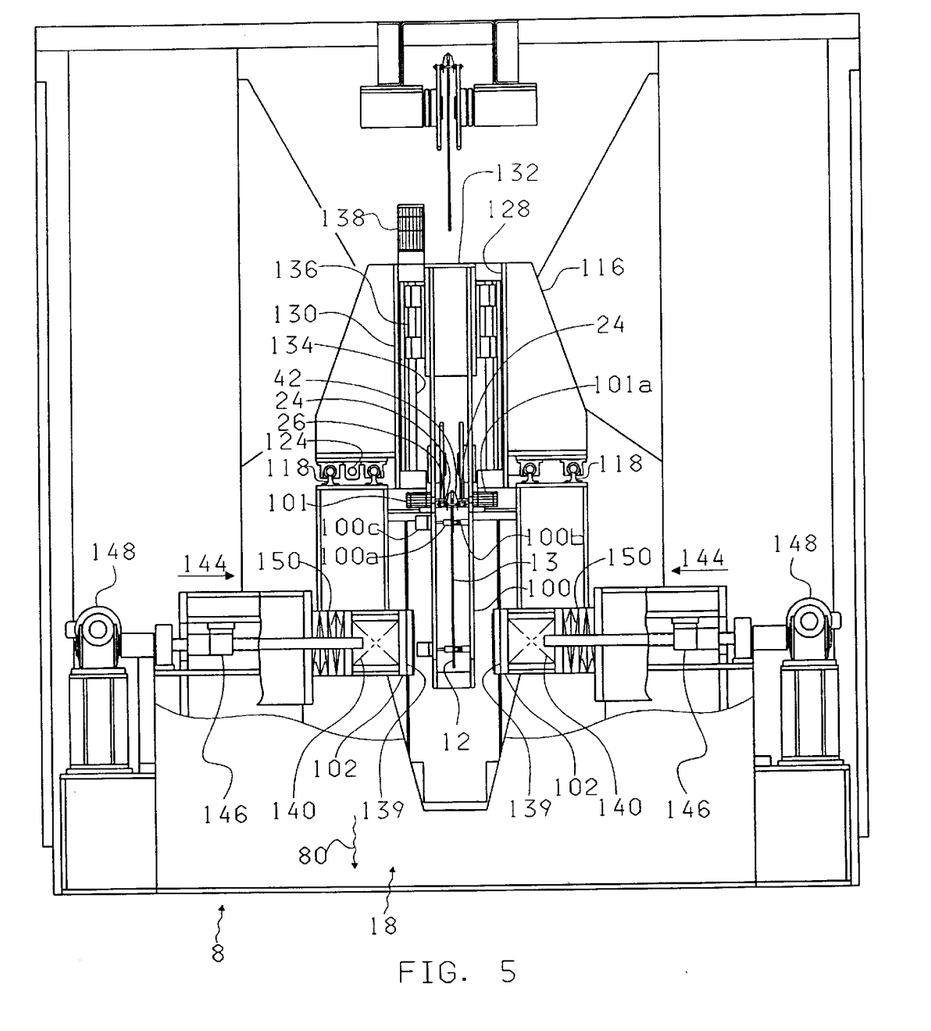
FIG. 5 is a cross-sectional elevation taken as indicated by section lines V—V in FIG. 1 to show a substrate testing station within the test system of FIG. 1.

FIG. 5 is a cross-sectional elevation of the test system 8 of FIG. 1, being taken as indicated by section lines V—V in FIG. 1 to show the test station 18, which will now be discussed with particular references being made to FIGS. 1 and 5.

According to a preferred version of the present invention, the flexible circuit substrate 13 includes a square panel area, with each side having a length of 30.48 cm (12.0 inches), on which circuits may be placed and accessed within the frame 12. This square area is divided in the horizontal direction of arrow 70 and in the vertical direction of arrow 80 into a number of substrate segments 14, each of which includes a similar or identical circuit, which can be tested in a similar or identical manner.

Thus, after a frame 12 holding a circuit substrate 13 is stopped within the test station 18 by the movement of drive chains 24, 26, this frame 12 is attached to a test transport carriage 100 and disengaged from the drive chains 24, 26. The process of attachment to the transport carriage 100 is brought about through the insertion of a number of pins 100a, through the holes 45d (shown in FIG. 3) within the frame 12, into sockets within supporting posts 100b. These pins 100a are inserted and held in place by means of actuators 100c mounted on the transport carriage 100. The process of disengaging the frame 12 from the drive chains 24, 26 is brought about by squeezing the opposing sides 45b and 45c (shown in FIG. 4) of the clip 42, by means of a jaws mechanism 101 operated by an actuator 101a.

The test transport carriage 100 is subsequently used to transport the frame 12 in a stepwise manner in both the horizontal direction of arrow 70, and opposite thereto, and in the vertical direction of arrow 80, and opposite thereto, so that the attached circuit substrate 13 is moved to present each substrate segment 14 between the opposing probe pads 102 for circuit tests applied to the individual circuit patterns within the substrate segments 14 in a sequential manner. All of the subsequent movements of the frame 12 during the process of testing individual circuits on the substrate 13 occur with the frame 12 entirely below the chains 24, 25.

The test transport carriage 100 is mounted to be lowered, in the vertical direction of arrow 80, into the position indicated by a phantom line 110, and to be moved laterally, in and opposite the directions of arrow 70, into the positions indicated by phantom lines 112 and 114, respectively. This movement is accomplished through the use of a laterally sliding structure 116, which moves laterally along rails 118, between the positions indicated by phantom lines 120, 122, being driven by a drive screw 124 turned by a motor 126. The laterally sliding structure 116 includes a rectangular opening 128, surrounded by walls 130 forming part of the structure 116, in which a guide block 132 slides vertically along rails 134, being driven by a drive screw 136 rotated by a motor 138. The guide block 132 is mechanically connected to the test transport carriage 100, so that the test transport carriage 100 moves laterally as determined by the operation of motor 126 and vertically as determined by the operation of motor 138.

U.S. Pat. No. 4,998,885 describes an interposer for electrically connecting two substrates with high density interconnections. The interposer comprises an elastomeric material surrounding fine metal wires which extend through the elastomeric material. The elastomeric material provides mechanical support and electrical isolation for the wires.

Each of the probe pads 102 is preferably built in accordance with the invention described in U.S. Pat. No. 4,998,885, with the various probes used to apply test signals and to measure the resulting signals being formed as wires extending within the probe pads 102 to adjacent substrates 139, from which connections are made within circuit boxes 140 to various test circuits (not shown) within the test system 8.

The two probe pads 102 are held in a position spaced away from the circuit substrate 13 to allow vertical and lateral movement of the substrate 13 as described above. When circuit test measurements are to be taken, the two probe pads 102 are moved into contact with the substrate 13 on opposing sides, with a significant force, such as several hundred pounds, being applied through the substrate 13. The two probe pads 102 are moved toward the substrate 13, in the directions indicated by adjacent arrows 144, and away therefrom, by means of drive screws 146 turned by gear-motors 148. Before the two probe pads 102 are brought into contact with the substrate 13, each of these pads 102 is moved in lateral, vertical, and rotational directions, into alignment with the circuit to be tested in a particular substrate segment 14 by means of a micropositioning system 150. Such an alignment process is needed, for example, to correct for variations in the placement of circuit traces on the substrate 13 and to correct for variations in the placement of the circuit substrate 13 within the frame 12.

Figures 6, 7:
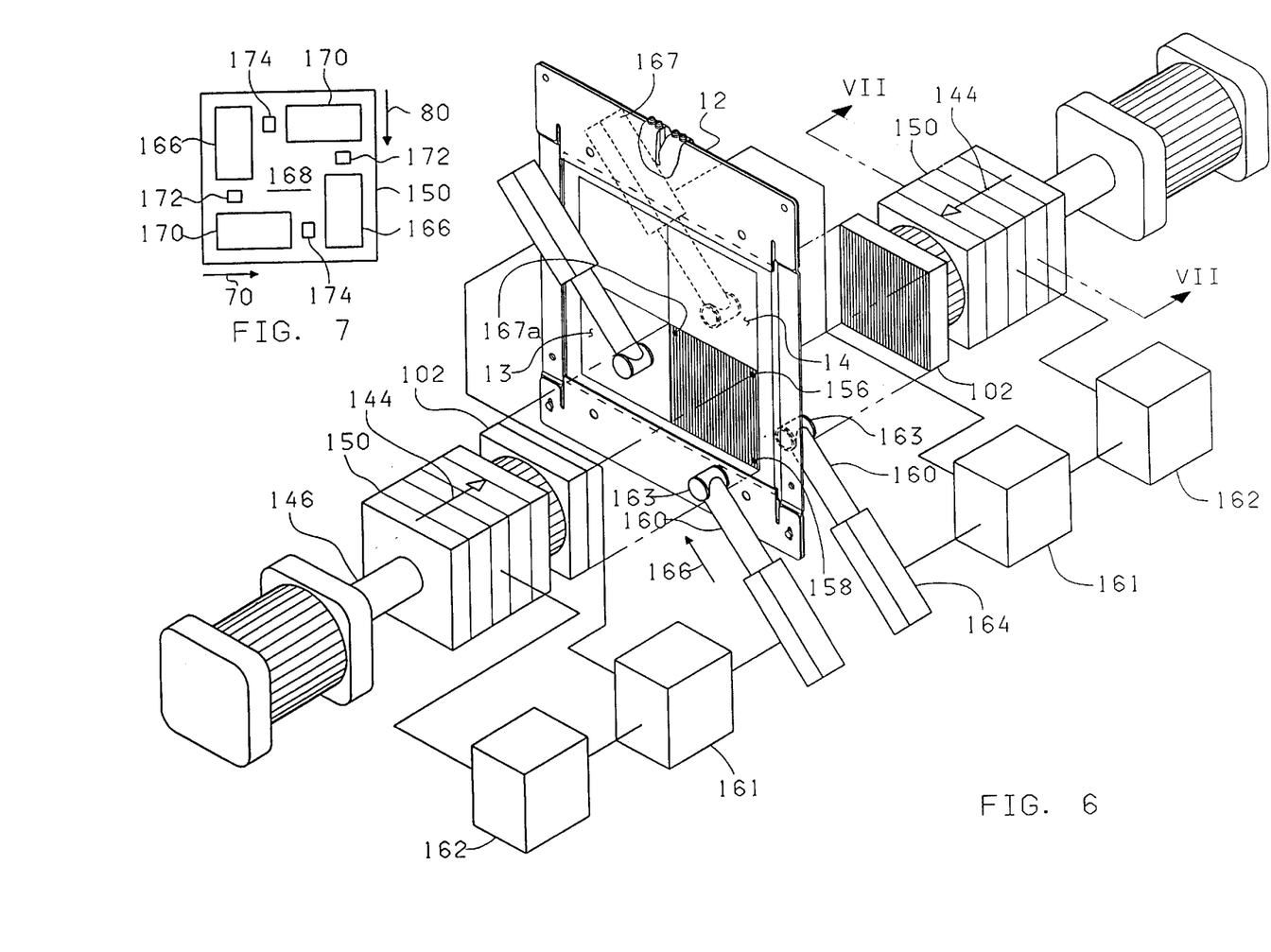
FIG. 6 is a schematic isometric view of components for aligning probe pads with circuits being tested within the testing station of FIG. 5.
FIG. 7 is a schematic transverse cross-sectional elevation of a positioning device within the components of FIG. 6, taken as indicating by section lines VII—VII in FIG. 6.

FIG. 6 is an isometric view of a flexible circuit substrate 13 within a frame 12 in the test station 18, showing features associated with the determination of the precise location of individual circuits on the substrate 13 and features associated with the adjustment of probe pads 102 to compensate for errors in the location of each such individual circuit on the substrate 13. Since the actual locations of various circuit features may vary between the two opposite sides of the substrate 13, separate systems on these opposite sides are used to detect the location of each individual circuit, as well as to adjust the associated probe pad 102.

A first method for determining the alignment of a particular circuit will now be discussed, with particular reference being made to FIG. 6. To implement this method, each substrate segment 14 is provided with an upper reference marking 156 and a lower reference marking 158, on each side of the substrate 13. Also on each side of the substrate 13, the test system 8 is provided with an optical system 160 and with support electronics 161, which are together capable of recognizing the reference markings 156, 158 and of reporting their locations, relative to idealized positions, to a controller 162 driving an associated micropositioning system 150. Such an optical system 160 includes a light source (not shown) and a camera unit 163 in which an image of a portion of the substrate 13 is focussed on a CCD (Charge Coupled Device) array. The optical system 160 is moved by means of a linear actuator 164, in the direction of arrow 166 into the space between the substrate 13 and the adjacent probe pad 102 when this probe is held away from the substrate 13, and being withdrawn in the direction opposite arrow 166 before the pads 102 are closed against the substrate 13.

Thus, before an the circuit on a particular substrate segment 14 is tested, the optical system 160 is moved, in the direction of arrow 166, to a pre-determined viewing position. Before or after this movement of the optical system 160, the substrate 13 is moved, by means of either or both the lateral drive motor 126 and the vertical drive motor 138, to a position in which the upper reference marking 156 of the particular substrate segment 15 would be viewed at a central position within the field of view of the camera unit 163 if the substrate segment 14 were in a nominal position relative to the camera unit 163. The lateral displacement of the actual image of this upper reference marking 156 from this central position, which represents a first lateral error distance, is stored within the support electronics 161.

Next, the substrate 13 is moved, by means of the vertical drive motor 138, to a position in which the lower reference marking 158 would be viewed in a central position within the field of view of the camera unit 163 if the substrate segment 14 were in the nominal position relative to the camera unit 163. The lateral displacement of the actual image of the lower reference marking 158 from the central position within the field of view of the camera unit 163, which represents a second lateral error distance, and the vertical displacement of the actual image of this lower reference marking 158 from this central position, which represents a vertical error distance, are also stored within he support electronics 161.

At this point, the error data stored in the support electronics 161 is used to calculate the actual position of the circuit on each side of the particular substrate segment 14 to be tested. The vertical position, relative to the lower reference marking 158, is derived from the vertical error distance. The lateral position, relative to the lower reference marking 158, is derived from the second lateral error distance. The angular displacement is derived from the angle having a tangent equal to the difference between the second and first lateral error distances, divided by the vertical distance through which the substrate is moved between viewing the upper reference marking 156 and the lower reference marking 158.

A second method for determining the alignment of a particular circuit will now be discussed, with continued reference being made to FIG. 6. With this method, a second optical system 167 is placed on each side of the circuit substrate 13, so that, on each side of the substrate 13, this second optical system 167 can view a second reference marking 167a associated with each substrate segment 14. With this method, the upper reference marking 156 is not used, while the second reference marking 167a is preferably diagonally opposite the lower reference marking 158. Each second optical system 167, which includes a camera unit 167b, is driven in and opposite to the direction of arrow 166 by means of an actuator 167c. The support electronics 161 for an optical system 160 on each side of the substrate 13 is shared by a second optical system 167 on the same side of the substrate 13. The four optical systems 160, 167 are simultaneously driven into the space between probe pads 102 and the substrate 13, and are simultaneously driven out of this space, following each measurement of circuit location, before probe pads 102 are driven against the substrate 13.

This second method provides the advantage, when compared to the first method described above, of not requiring movement of the substrate 13 between viewing the first and second reference markings for each substrate segment 14. With the second method, all four reference markings 158, 167a on both sides of the substrate 13 are simultaneously viewed by the four camera units 163. The vertical and lateral error distances are derived, for example, as in the first method, by calculating the distance between the actual position of the first reference marking 158 on each side of the substrate 13, and a theoretical position at which this marking should be placed. The angular error is calculated by comparing the actual position of the second reference marking 167a on each side of the substrate 13 with the actual position of the corresponding first reference marking 158.

The test system 8 may be configured to use either the first or second method, as described above, or to use both methods. The choice of an optimum method may be made in part in accordance with the characteristics of the circuits being tested. For example, if such circuits are too small and too crowded together, there may not be space for the simultaneous use of four cameras, as required by the second method.

U.S. Pat. No. 5,434,504 describes position sensors for detecting the position of a linear motor relative to a platen. In particular, these sensors are described in an arrangement including a Sawyer motor forcer, which is preferably used in the present invention as a micropositioner 150 to vary the location of each probe pad 102, compensating for variations in the location of circuits to be tested, with such variations in the location of circuits to be tested having been detected as described above.

FIG. 7 is a schematic transverse cross-sectional view, taken as indicated by section lines VII—VII in FIG. 6, showing the relative positions of the actuators and sensors within the micropositioner 150. Each micropositioner 150 includes a pair of vertical linear actuators 168, moving the associated probe pad 102 in and opposite the vertical direction of arrow 80, located at diagonally opposite corners of a platen 169. A pair of lateral linear actuators 170, moving the associated probe pad 102 in and opposite the lateral direction of arrow 70, are located at the other diagonally opposite corners of the platen 169. The micropositioner 150 also includes a pair of vertical sensors 172, measuring vertical motion, and a pair of lateral sensors 174, measuring lateral motion. To move the associated probe pad 102 vertically, the two vertical linear actuators 168 are driven to cause motion in the same direction. To move the associated probe pad 102 laterally, the two lateral actuators 170 are driven to cause motion in the same direction. To rotate the associated pad 102 through a small angle, diagonally opposite actuators, i.e. the two vertical linear actuators 168 or the two lateral actuators 170 are driven to cause motion in opposite directions.

Referring again to FIGS. 1, 5, and 6, when lateral, vertical, and rotational corrections have been made in the locations of both probe pads 102 to compensate for the errors in the locations of the circuits to be tested on each side of the substrate 13 and within a particular substrate segment 14, and when the optical systems 160 have been withdrawn by linear actuators opposite the direction of arrow 166, the probe pads 102 are closed on this segment 14 from each side of the substrate 13, by means of the gearmotors 148 driving screws 146. After these probe pads 102 are closed, developing a compression force of several hundred pounds across the substrate 13, various measurements are performed, as signals are applied to various of the probes within the probe pads 102, and as signals from various of these probes are evaluated to determine the integrity of circuit paths within and along the substrate 13. For each substrate segment 14, results of this testing sufficient to indicate whether circuits on the segment 14 are satisfactory are stored as data values in the memory of a controller (not shown) operating the test system 8.

This process is completed for each of the substrate segments 14, with measurements being made using the optical systems 160 and resulting corrections being made using the micropositioners 150 between sequentially adjacent measurements using the probe pads 102.

Referring to FIGS. 1, 3, 4, and 5, when the circuit test operations are complete for each of the segments 14 on a particular substrate 13, the associated frame 12 is engaged with drive chains 24, 26 and disengaged from the transport carriage 100. The engagement of the frame 12 with the drive chains 24, 26 occurs as the frame 12 is moved laterally by means of lateral movement of transport carriage 100 by the motor 126 to align slot 43 with mounting pin 41, and as the frame 12 is subsequently moved upward, by means of upward movement of transport carriage 100 by the motor 138, so that mounting pin 41 extends through the enlarged end 44 of slot 43. During this upward movement of the frame 12, the opposing sides 45b, 45c are held together by means of actuator 101a, so that the narrow central portion 45a of mounting pin 41 passes through the slot 43. After the frame 12 is thus engaged with drive chains 24, 26, the frame 12 is disengaged from transport carriage 100, with actuators 100c pulling pins 100a outward from holes 45d in the frame 12.

Continuing to refer to FIG. 1, after the frame 12 in test station 18 is disengaged from transport carriage 100, the movement of drive chains 24, 26 is started to move this frame 12 to the unloading station 20, and to move another frame 12 from the loading station 15 to test station 18. This movement of drive chains 24, 26 can usually be started without waiting for further processes to occur, because the processes occurring within test station 18 generally take longer than those occurring in loading station 15 or in unloading station 20.

Punching Station

Figure 8:
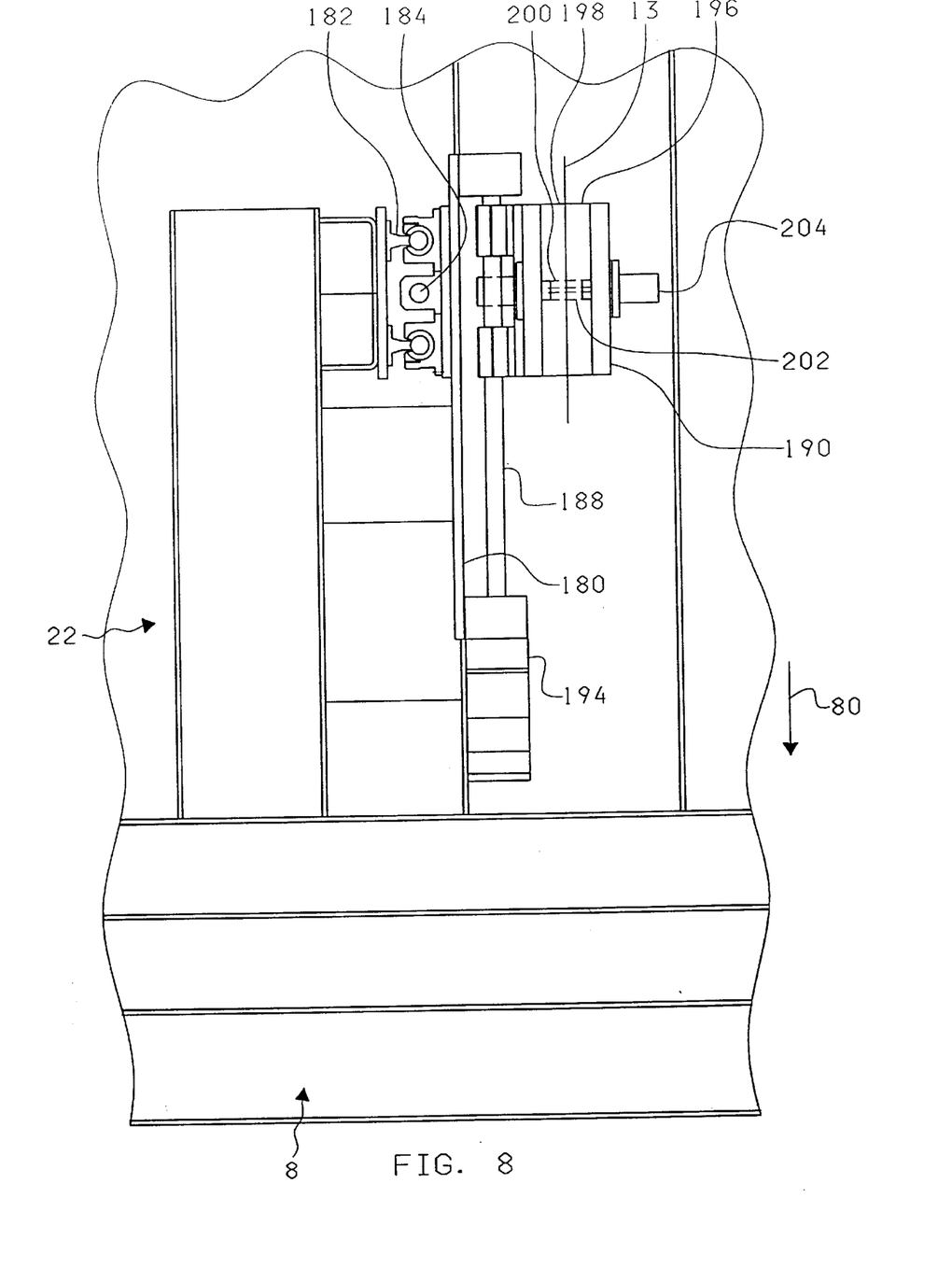
FIG. 8 is a cross-sectional elevation taken as indicated by section lines VIII—VIII in FIG. 1 to show a substrate punching station within the test system of FIG. 1.

FIG. 8 is a cross-sectional elevation of the test system 8, taken as indicated by section lines VIII—VIII in FIG. 1 to show characteristics of the punching station 22, which provides, in a circuit substrate 13 being held in the unloading station 20, the selective destruction of substrate sections 14 including circuits which have failed test processes occurring within test station 18.

Referring to FIGS. 1 and 8, as previously described in the section above concerning the test station 18, data indicating which circuits have failed the test processes is stored within the memory of a controller operating the test system 8. When the frame 12 holding each particular circuit substrate 13 is placed within the unloading station 20, this data is checked to determine if one or more of the substrate sections 14 of the substrate 13 includes a circuit which has failed the testing process. If such a failure has occurred, the punching station 22 is driven to punch a hole within each section 14 including a circuit which has failed.

The punching station 22 includes a laterally-moving carriage 180, sliding along rails 182 in and opposite the lateral direction of arrow 70, being driven by a screw 184 rotated by a motor 186. This laterally-moving carriage 180 includes a pair of rails 188 on which a punching carriage 190 slides in and opposite the vertical direction of arrow 80, being driven by a screw 192 rotated by a motor 194. The punching carriage 190 includes a front punch arm 196 and a rear punch arm 198, which extend along opposite sides of the circuit substrate 13 as the laterally-moving carriage 180 is moved in the direction of arrow 70. The rear punch arm 198 includes a die 200, and front punch arm 196 includes a includes a punch 202, which is driven by an actuator 204 through the intervening circuit substrate 13 into the die 200.

Thus, after a circuit substrate 13 including one or more sections 14 having circuits failing the tests occurring in test station 18 is moved into unloading station 20, the punching carriage 190 is moved, by means of motors 186, 194 to each of the sections 14 having such a failing circuit, where the punch 202 is operated by actuator 204 to punch a hole in the circuit substrate 13.

Unloading Station

Referring to FIG. 1, when the processes described above as occurring within the punching station 22 have been completed, or if they are not required because none of the circuits on the substrate 13 within the unloading station 20 have failed testing, this substrate 13 is unloaded from its frame 12. The unloading process occurring within unloading station 20 is similar to the loading process occurring within loading station 15, except that the sequential order of events is reversed.

The unloading station 20 includes an output section 210, which is moved laterally, in and opposite the direction of arrow 70, along rails 212, being driven by a motor 214 turning a drive screw (not shown). The output section 210 includes a spring mounted tray 216, on which a stack 218 of substrates 13 having completed the testing process is placed, and a vacuum plenum 220. The vacuum planum 220 is moved linearly by means of a linear actuator 222 and is pivoted about a pivot shaft 224 by means of a rotary actuator 226.

The unloading process begins with the movement of output section 210 opposite the lateral direction of arrow 70. The vacuum plenum 220 raised by linear actuator 222, pivoted toward the rear, in the direction of arrow 82 (shown in FIG. 2) and extended toward the rear, in the direction of arrow 84 (also shown in FIG. 2), so that the vacuum plenum 220 lies adjacent the substrate 13 within frame 12. A vacuum is next established within the plenum 220 so that the substrate 13 is held against the adjacent surface of plenum 220. Actuators 228 operate in a manner similar to that of actuators 90, described above in reference FIG. 2 and to supply section 15, to open upper clip 46 and lower clip 48, causing the substrate 13 to be released from frame 12. With the substrate 13 attached to vacuum plenum 220, the output section 210 is moved to the right, in the direction indicated by arrow 70, removing the substrate 13 from frame 12, the plenum 220 is moved toward the front, opposite the direction of arrow 82, is pivoted downward, opposite the direction of arrow 82, and is extended downward to place the substrate 12 atop the stack 218 of substrates having completed the testing processes.

When sufficient substrates 13 have been accumulated within the stack 218, it is removed through a slot 230 below a front wall 232 of the output section 210.

Bar-Code Reader

Continuing to refer to FIG. 1, the test system 8 is optionally also provided with a bar-code reader 234, which is equipped to read bar codes present on either or both sides of the circuit substrate 13. Such bar codes may be used to identify each individual substrate 13, or they may be used to differentiate among substrate segments 14 on an individual substrate 13.

The bar-code reader 234 includes a reading head 236, which is built in a manner well known to those skilled in the art of such devices, including, for example a laser light source and a light detector, for illuminating and reading bar codes on the surface of a substrate 13 held in a frame 12 within the loading station 15. If bar codes are to be read on both sides of the substrate 13, a separate reading head 236 is used on each of these sides. Thus, the bar-code reader 234 is used after a substrate 13 is loaded onto a frame 12 and before the frame 12 is moved from loading station 15 to test station 18. The reading head 236 is moved along the surface of the substrate 13 in a manner analogous to that described above in relation to punching station 22, being moved vertically by means of a motor 238 and horizontally by use of a motor 240.

While the invention has been described in its preferred forms or embodiments with some degree of particularity, it is understood that this description has been given only by way of example and that numerous changes in the details of construction, fabrication and use, including the combination and arrangement of parts, may be made without departing from the spirit and scope of the invention. In particular, it is understood that alternative means, such as linear motors, may be substituted for various of the motor and drive-screw mechanisms described herein.

What is claimed is:

1. Apparatus for applying electrical tests to a plurality of circuit substrates, with said apparatus comprising:

a first transport system moving a plurality of transport frames around a circuitous path;

a loading station loading a circuit substrate within said plurality of circuit substrates onto a transport frame within said plurality of transport frames in attachment with said first transport system;

a test station including a first plurality of probes movable against a first surface of said circuit substrate in a first inspection area, a second transport system moving said transport frame with said circuit substrate loaded thereon so that said first surface is moved to said first inspection area, and frame transfer means for transferring said transport frame with said circuit substrate loaded thereon between said first and second transport systems; and an unloading station unloading said circuit substrate from said transport frame in attachment with said first transport system.

2. The apparatus of claim 1, wherein said first transport system moves said frames in an incremental movement, stopping said movement with a first transport frame in said plurality of transport frames positioned in said loading station, with a second transport frame in said plurality of transport frames positioned in said test station, and with a third transport frame in said plurality of transport frames positioned in said unloading station, and said first transport system moves transport frames after processes are completed within said loading station, said test station, and said unloading station, with said third transport frame being moved from said unloading station onto a return path toward said loading station, with said second transport frame being moved from said test station to said unloading station, and with said first transport frame being moved from said loading station to said test station.

3. The apparatus of claim 2, wherein each transport frame within said plurality of transport frames includes an upper clip gripping an upper edge portion of a circuit substrate within said plurality of circuit substrates and a lower clip gripping a lower edge portion of said circuit substrate, said loading station includes first release means opening and closing said upper and lower clips and insertion means inserting said circuit substrate within said upper and lower clips, with said upper and lower clips open, and said unloading stations includes second release means opening said upper and lower clips and removal means removing said circuit substrate from said upper and lower clips, with said upper and lower clips open.

4. The apparatus of claim 3, wherein said lower clip is slidably mounted on said transport frame, being held downward to apply a tensioning force to said circuit substrate gripped by said upper and lower clips, and said loading station includes clip moving means holding said lower clip in a raised position with said lower clip held open by said first release means and allowing said lower clip to move downward, applying said tensioning force to said circuit substrate, after said lower clip is closed by said first release means.

5. The apparatus of claim 3, wherein said loading station includes:

a tray for holding said plurality of circuit substrates in a stack of said circuit substrates, with each said circuit substrate within said stack of said circuit substrates extending horizontally; and a vacuum plenum moving downward to pick up an uppermost circuit substrate within said stack of said circuit substrates, pivoting to align said uppermost circuit substrate in a vertically-extending orientation with a transport frame within said plurality of transport frames in said loading station, and moving laterally to slide said uppermost circuit substrate into said upper and lower clips, as said upper and lower clips are held open by said first release means.

6. The apparatus of claim 3, wherein said unloading station includes:

a tray for holding said plurality of circuit substrates in a stack of said circuit substrates, with each said circuit substrate within said stack of said circuit substrates extending horizontally; and a vacuum plenum engaging said circuit substrate within said transport frame in attachment with said first transport system, moving laterally to slide said circuit substrate out of said upper and lower clips, as said upper and lower clips are held open by said second release means, pivoting to align said circuit substrate horizontally, and releasing said circuit substrate into said stack of said circuit substrates.

7. The apparatus of claim 2, wherein said first transport system includes a flexible member extending around said circuitous path, driven in said incremental movement, with a plurality of attachment pins extending horizontally therefrom, and with each attachment pin within said plurality of attachment pins including an enlarged pin portion and a narrowed pin portion, each transport frame within said plurality of transport frames includes bracket with a slotted hole pivotable at said enlarged pin portion and removable from said narrowed pin portion, and said frame transfer means includes an actuator moving said bracket between a position in which said slotted hole extends over said enlarged pin portion and a position in which said slotted hole extends over said narrowed pin portion.

8. The apparatus of claim 2, wherein said first transport system includes a pair of drive chains extending around said circuitous path, driven in said incremental movement, with a plurality of attachment pins extend horizontally therebetween, and with each attachment pin within said plurality of attachment pins including a central narrowed pin portion extending between enlarged pin portions, each transport frame within said plurality transport frames includes a clamp with opposite sides of said clamp extending over said an attachment pin within said plurality of attachment pins, with each said opposite side including a slotted hole, with said slotted holes being pivoted on said enlarged pin portions; and said frame transfer means includes actuation means squeezing said opposite sides of said clamp toward one another so that both of said opposite sides extend along said central narrowed pin portion.

9. The apparatus of claim 1, wherein said first plurality of probes includes an array of probes, said second transport system moves said transport frame in a series of incremental movements, stopping motion of said transport frame at a plurality of positions, wherein an individual segment of said circuit substrate is adjacent said array of probes with said frame at each position within said plurality positions, and said test station moves said array of probes into contact with said circuit substrate to perform electrical tests at each said individual segment of said circuit substrate.

10. The apparatus of claim 9, wherein said test station additionally includes:

position detection means detecting a position of an individual said segment of said circuit substrate stopped adjacent said array of probes; and a micropositioner operating to align said array of probes with said individual said segment in response to output signals from said position detection means.

11. The apparatus of claim 10, wherein said position detection means comprises a first camera moving into a space between said array of probes and said circuit substrate to view first and second reference markings at said individual said segment, said second transport system moves said circuit substrate between a first position in which said first camera views said first reference marking and a second position in which said first camera views said second reference marking, and said first camera is withdrawn from said space between said array of probes and said circuit substrate before said array of probes is brought into contact with said circuit substrate.

12. The apparatus of claim 10, wherein said position detection means comprises a first camera moving into a space between said array of probes and said circuit substrate to view a first reference marking at said individual said segment and a second camera moving into said space between said array of probes and said circuit substrate to view a second reference marking at said individual said segment, and said first and second cameras are withdrawn from said space between said array of probes and said circuit substrate before said array of probes is brought into contact with said circuit substrate.

13. The apparatus of claim 1, wherein each transport frame within said plurality of transport frames includes an aperture through which a second surface of said circuit substrate loaded on said transport frame is outwardly exposed, said second surface of said circuit substrate being on an opposite side of said circuit substrate from said first surface of said circuit substrate, and said test station additionally includes a second plurality of probes movable against said second surface of said circuit substrate.

14. The apparatus of claim 13, wherein said first plurality of probes includes a first array of probes, said second plurality of probes includes a second array of probes, said second transport system moves said transport frame in a series of incremental movements, stopping motion of said transport frame at a plurality of positions, wherein an individual segment of said circuit substrate is between said first array of probes and said second array of probes with said frame at each position within said plurality of positions, and said test station moves said first and second arrays of probes into contact with said circuit substrate to perform electrical tests at each said individual segment of said circuit substrate.

15. The apparatus of claim 14, wherein said test station additionally includes:

first position detection means detecting a position of surface markings on an individual said segment of said circuit substrate stopped adjacent with said first array of probes, wherein said surface markings are additionally on said first surface of said circuit substrate;

second position detection means detecting a position of surface markings on said individual said segment of said circuit substrate stopped adjacent with said first second array of probes, wherein said surface markings are additionally on said second surface of said circuit substrate;

a first micropositioner operating to align said first array of probes with said individual said segment in response to output signals from said first position detection means; and a second micropositioner operating to align said second array of probes with said individual said segment in response to output signals from said second position detection means.

16. The apparatus of claim 15, wherein said first position detection means comprises a first camera moving into a space between said first array of probes and said circuit substrate to view first and second reference markings on said first side of said circuit substrate at said individual said segment, said second position detection means comprises a second camera moving into a space between said second array of probes and said circuit substrate to view third and fourth reference markings on said second side of said circuit substrate at said individual said segment, said second transport system moves said circuit substrate between a first position in which said first camera views said first reference marking and a second position in which said first camera views said second reference marking, said first camera is withdrawn from said space between said first array of probes and said circuit substrate before said first array of probes is brought into contact with said circuit substrate, and said second camera is withdrawn from said space between said second array of probes and said circuit substrate before said second array of probes is brought into contact with said circuit substrate.

17. The apparatus of claim 15, wherein said first position detection means comprises a first camera moving into a space between said first array of probes and said circuit substrate to view a first reference marking at said individual said segment and a second camera moving into said space between said first array of probes and said circuit substrate to view a second reference marking at said individual said segment, with said first and second reference markings being on said first side of said circuit substrate;

said second position detection means comprises a third camera moving into a space between said second array of probes and said circuit substrate to view a third reference marking at said individual said segment and a fourth camera moving into said space between said second array of probes and said circuit substrate to view a fourth reference marking at said individual said segment, with said third and fourth reference markings being on said second side of said circuit substrate;

said first and second cameras are withdrawn from said space between said first array of probes and said circuit substrate before said first array of probes is brought into contact with said circuit substrate; and said third and fourth cameras are withdrawn from said space between said second array of probes and said circuit substrate before said second array of probes is brought into contact with said circuit substrate.

18. The apparatus of claim 1, wherein said second transport system moves said transport frame among a plurality of positions, with a circuit on an individual segment of said circuit substrate loaded on said frame being tested when said frame is stopped at each position within said plurality of positions, data indicating the segments including circuits which failed testing within said test station is stored, said apparatus includes a punch station movable along said circuit substrate among each said individual segment, with said punch station being used to punch a hole in each said individual segment containing one of said circuits which failed testing, according to said data.

19. The apparatus of claim 18, wherein said punch station is moved along said circuit substrate while said circuit substrate is held in said transport frame in attachment with said first transport system.

20. The apparatus of claim 1, wherein said second transport system moves said transport frame among a plurality of positions, with a circuit on an individual segment of said circuit substrate loaded on said frame being tested when said frame is stopped at each position within said plurality of positions, and said apparatus includes a bar code reading head movable along said circuit substrate to read a bar code placed on each said individual segment of said circuit substrate.

21. The apparatus of claim 20, wherein said bar code reading head is moved along said circuit substrate while said circuit substrate is held in said transport frame in attachment with said first transport system.

22. Apparatus for moving a flexible circuit substrate through a circuit testing process in a flat, tensioned condition, wherein said apparatus comprises:

a transport frame having an upper clip gripping an upper edge portion of said circuit substrate and a lower clip gripping a lower edge portion of said circuit substrate, with said lower clip being slidable along said transport frame in a vertical direction, with said circuit substrate being held in a vertical orientation under tension from weight of said lower clip, in attachment to said transport frame;

a loading station loading said circuit substrate into said transport frame, with said loading station including first release means opening and closing said upper and lower clips, insertion means inserting said circuit substrate within said upper and lower clips with said upper and lower clips open, and clip moving means holding said lower clip in a raised position with said lower clip held open by said release means and allowing said lower clip to move downward, applying a tensioning force to said circuit substrate, after said lower clip is closed by said first release means;

a circuit test station in which electrical tests are applied to circuits extending along said circuit substrate;

an unloading station unloading said circuit substrate from said transport frame, with said unloading station including second release means opening and closing said upper and lower clips and removal means removing said circuit substrate from said upper and lower clips, with said upper and lower clips open; and first transport means moving said transport frame from said loading station to said circuit test station and from said circuit test station to said unloading station, with said circuit substrate being held in said vertical orientation under tension from weight of said lower clip.

23. The apparatus of claim 22, wherein said loading station includes:

a tray for holding a first plurality of circuit substrates in a stack of said circuit substrates, with each said circuit substrate within said stack of said circuit substrates extending horizontally; and a vacuum plenum moving downward to pick up an uppermost circuit substrate within said stack of said circuit substrates, pivoting to align said uppermost circuit substrate in a vertically-extending orientation with a transport frame within said plurality of transport frames in said loading station, and moving laterally to slide said uppermost circuit substrate into said upper and lower clips, as said upper and lower clips are held open by said first release means.

24. The apparatus of claim 22, wherein said unloading station includes:

a tray for holding a second plurality of circuit substrates in a stack of said circuit substrates, with each said circuit substrate within said stack of said circuit substrates extending horizontally; and a vacuum plenum engaging said circuit substrate within said transport frame in attachment with said first transport system, moving laterally to slide said circuit substrate out of said upper and lower clips, as said upper and lower clips are held open by said second release means, pivoting to align said circuit substrate horizontally, and releasing said circuit substrate into said stack of said circuit substrates.

25. The apparatus of claim 22, wherein said circuit test station includes:

a first array of probes moved against a first surface of said circuit substrate;

a second array of probes moved against a second surface of said circuit substrate, with said first and second surfaces being on opposite sides of said circuit substrate, and with said first and second arrays of probes being moved simultaneously against said circuit substrate;

second transport means for moving said transport frame with said circuit substrate loaded thereon in a vertical orientation between said first and second arrays of probes; and frame transfer means for transferring said transport frame with said circuit substrate loaded thereon in a vertical orientation between said first and second transport means.

26. A method for applying electrical tests to a circuit substrate, wherein said method comprises steps of:

a) opening upper and lower clips of a transport frame, with said lower clip in a raised position;

b) sliding said circuit substrate into said upper and lower clips in a vertical orientation;

c) closing said upper and lower clips;

d) lowering said lower clip to provide a tensioning force on said circuit substrate;

e) moving said transport frame, with said circuit substrate attached thereto in a vertical orientation, to a testing station;

f) moving said transport frame within said testing station, with said circuit substrate being moved in a vertical orientation between a pair of probe arrays adjacent opposite sides of said substrate, and with said probe arrays being simultaneously closed on opposite sides of said circuit substrate to apply and measure signals at circuits within said circuit substrate;

g) moving said circuit substrate from said testing station to an unloading station;

h) opening said upper and lower clips; and i) sliding said circuit substrate out of said upper and lower clips.

27. The method of claim 26, wherein said step a) is preceded by steps of lifting said circuit substrate from a supply stack including a plurality of similar circuit substrates in a horizontal orientation, with a vacuum plenum, and pivoting said vacuum plenum to bring said circuit substrate attached thereto into a vertical orientation, and said step a) is accomplished by sliding said vacuum plenum with said circuit substrate attached thereto between said upper and lower clips.

28. The method of claim 26, wherein said steps g) and h) occur with said circuit substrate in a vertical orientation, said step i) is accomplished by sliding a vacuum plenum with said circuit substrate attached thereto between said upper and lower clips, and said step i) is followed by steps of pivoting said vacuum plenum to bring said circuit substrate attached thereto into a horizontal orientation, and releasing said circuit substrate from said vacuum plenum to be placed atop a stack of tested circuit substrates.

29. The method of claim 26, wherein said circuit substrate includes a plurality of segments, and within said step f), said circuit substrate is moved among a plurality of stopping positions, with a segment within said plurality of segments being stopped between said pair of probe arrays at each stopping position within said plurality of stopping positions, and with said probe arrays being simultaneously dosed on opposite sides of said segment of said circuit substrate at each said stopping position.

30. The method of claim 29, wherein, before said probe arrays in said pair of probe arrays are simultaneously closed at each said stopping position, each of said probe arrays is aligned with visual reference markings on a side of said circuit substrate adjacent said probe array being aligned.

31. The method of claim 30, wherein said probe arrays are aligned by the steps of:

moving a first camera into a position between a first of said probe arrays, adjacent a first side of said circuit substrate, and said circuit substrate;

moving a second camera into a position between a second of said probe arrays, adjacent a second side of said circuit substrate, said second side being opposite said first side, and said circuit substrate;

moving said circuit substrate into a position in which said first camera views a first reference marking on said first side of said circuit substrate, and in which said second camera views a second reference marking on said second side of said circuit substrate;

recording data from said first and second cameras indicating actual positions of said first and second reference markings;

moving said circuit substrate into a position in which said second camera views a third reference marking on said first side of said circuit substrate, and in which said second camera views a fourth reference marking on said second side of said circuit substrate;

moving said first of said probe arrays in response to output signals from said first camera; and moving said second of said probe arrays in response to output signals from said second camera.

32. The method of claim 30, wherein said probe arrays are aligned by the steps of:

moving first and second cameras into positions between a first of said probe arrays, adjacent a first side of said circuit substrate, and said circuit substrate;

moving third and fourth cameras into positions between a second of said probe arrays, adjacent a second side of said circuit substrate, said second side being opposite said first side, and said circuit substrate;

moving said circuit substrate into a position in which said first camera views a first reference marking on said first side of said circuit substrate, said second camera views a second reference marking on said first side of said circuit substrate, said third camera views a third reference marking on said second side of said circuit substrate, and said fourth camera views a fourth reference marking on said second side of said circuit substrate;

moving said first of said probe arrays in response to output signals from said first and second cameras; and moving said second of said probe arrays in response to output signals from said third and fourth cameras.

33. The method of claim 29, wherein within said step f), data is stored indicating which of said segments include a circuit which fails testing, and between said steps g) and h) said method includes an additional step of punching a hole by a punch moving along said circuit substrate within each of said segments which includes a circuit which fails testing.

34. The method of claim 29, wherein, between said steps d) and e) said method includes an additional step moving a bar code reading head along said circuit substrate to read bar codes associated with various of said segments.

* * * * *